United States Patent
Kong et al.

(10) Patent No.: US 10,901,038 B2
(45) Date of Patent: Jan. 26, 2021

(54) ARTIFICIAL INTELLIGENT FUEL CELL SYSTEM

(71) Applicant: LG CHEM, LTD., Seoul (KR)

(72) Inventors: Chang Sun Kong, Daejeon (KR); Jae Choon Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 256 days.

(21) Appl. No.: 16/067,000

(22) PCT Filed: Sep. 14, 2017

(86) PCT No.: PCT/KR2017/010088
§ 371 (c)(1),
(2) Date: Jun. 28, 2018

(87) PCT Pub. No.: WO2018/056639
PCT Pub. Date: Mar. 29, 2018

(65) Prior Publication Data
US 2019/0018067 A1 Jan. 17, 2019

(30) Foreign Application Priority Data
Sep. 26, 2016 (KR) .................. 10-2016-0123125

(51) Int. Cl.
*H01M 8/04492* (2016.01)
*H01M 8/04992* (2016.01)
(Continued)

(52) U.S. Cl.
CPC .......... *G01R 31/367* (2019.01); *B60L 3/0053* (2013.01); *B60L 58/30* (2019.02);
(Continued)

(58) Field of Classification Search
CPC ....... G01R 31/367; G06N 20/00; B60L 58/30; B60L 3/0053; B60L 2260/46;
(Continued)

(56) References Cited

U.S. PATENT DOCUMENTS 7,457,785 B1 11/2008 Greitzer et al.
7,867,664 B2 1/2011 Saito et al.
(Continued)

FOREIGN PATENT DOCUMENTS

CN 1680894 A 10/2005
JP 4-87263 A 3/1992
(Continued)

OTHER PUBLICATIONS

European Search Report for Appl. No. 17853353.5 dated Jul. 16, 2019.
(Continued)

*Primary Examiner* — Raymond L Nimox
(74) *Attorney, Agent, or Firm* — Birch, Stewart, Kolasch & Birch, LLP

(57) ABSTRACT

An artificial intelligent fuel cell system according to an exemplary embodiment of the present invention may include: a fuel cell stack in which a plurality of unit cells is combined for generating electric energy with an electrochemical reaction; a sensor unit which measures in real time data about each of the unit cells forming the fuel cell stack, temperature, pressure, humidity, and flow rates of reaction gases, and cooling water, and current and voltage data during an operation of a fuel cell; an artificial intelligent unit which collects the data measured by the sensor unit with a predetermined time interval, generates a model for predicting and controlling performance of the fuel cell through the learning and analysis of the collected data, compares the generated model with the data measured in real time and diagnoses a state of the fuel cell stack, and generates a control signal for changing an operation condition of the fuel cell stack; and a control unit which changes the operation condition of the fuel cell stack according to the generated control signal.

8 Claims, 7 Drawing Sheets

(51) Int. Cl.
  *G01R 31/367* (2019.01)
  *G06N 20/00* (2019.01)
  *B60L 58/30* (2019.01)
  *H01M 8/0438* (2016.01)
  *G05B 13/04* (2006.01)
  *G05B 13/02* (2006.01)
  *B60L 3/00* (2019.01)
  *H01M 8/04664* (2016.01)
  *H01M 8/04537* (2016.01)
  *H01M 8/0432* (2016.01)

(52) U.S. Cl.
  CPC ....... *G05B 13/0265* (2013.01); *G05B 13/048* (2013.01); *G06N 20/00* (2019.01); *H01M 8/0432* (2013.01); *H01M 8/0438* (2013.01); *H01M 8/04492* (2013.01); *H01M 8/04544* (2013.01); *H01M 8/04574* (2013.01); *H01M 8/04679* (2013.01); *H01M 8/04992* (2013.01); *B60L 2260/46* (2013.01); *B60L 2260/50* (2013.01)

(58) Field of Classification Search
  CPC ............ B60L 2260/50; G05B 13/0265; G05B 13/048; H01M 8/0432; H01M 8/0438; H01M 8/04492; H01M 8/04544; H01M 8/04574; H01M 8/04679; H01M 8/04992
  See application file for complete search history.

(56) References Cited

U.S. PATENT DOCUMENTS

| | | | |
|---|---|---|---|
| 2001/0039481 A1* | 11/2001 | Tremblay | H01M 8/04589 702/35 |
| 2006/0058932 A1 | 3/2006 | Garg et al. | |
| 2006/0289312 A1* | 12/2006 | Tremblay | C25B 15/02 205/335 |
| 2008/0166604 A1 | 7/2008 | Weingaertner et al. | |
| 2010/0152905 A1* | 6/2010 | Kusiak | G05B 17/02 700/276 |
| 2015/0021193 A1* | 1/2015 | Verfu | C25B 1/14 205/337 |
| 2016/0006059 A1 | 1/2016 | Kwon et al. | |
| 2016/0006060 A1* | 1/2016 | Kwon | H01M 8/04335 429/442 |
| 2017/0237096 A1* | 8/2017 | Zenith | G01R 31/367 429/432 |

FOREIGN PATENT DOCUMENTS

| | | |
|---|---|---|
| JP | 2004-179003 A | 6/2004 |
| JP | 2006-202555 A | 8/2006 |
| JP | 2007-123007 A | 5/2007 |
| JP | 2007-305327 A | 11/2007 |
| JP | 2009-21194 A | 1/2009 |
| KR | 10-2016-0007826 A | 1/2016 |
| KR | 10-2016-0007828 A | 1/2016 |

OTHER PUBLICATIONS

International Search Report (PCT/ISA/210) issued in PCT/KR2017/010088, dated Mar. 26, 2018.
European Office Action dated Apr. 30, 2020, for European Application No. 17853353.5.
Japanese Notice of Reasons for Refusal dated Mar. 24, 2020, for Japanese Application No. 2019-500363, with an English translation.

\* cited by examiner

ARTIFICIAL INTELLIGENT FUEL CELL SYSTEM

TECHNICAL FIELD

The present invention relates to an artificial intelligent fuel cell system, and more particularly, to an artificial intelligent fuel cell system, which learns and analyzes data collected with a predetermined time interval by using machine learning and a time-series analysis to generate a model for predicting and controlling performance of a fuel cell, compares the generated model with measured data to distinguish the change in performance over time of a fuel cell stack into a temporary and short-term performance degradation state and a long-term and irreversible performance degradation state and diagnose the performance change state, and generates a control signal for changing an operation condition of the fuel cell stack according to the diagnosed state of the fuel cell stack.

The present specification claims priority to and the benefit of Korean Patent Application No. 10-2016-0123125 filed in the Korean Intellectual Property Office on Sep. 26, 2016, the entire contents of which are incorporated herein by reference.

BACKGROUND ART

A fuel cell is an electrical power generating apparatus in which hydrogen and oxygen react electrochemically as the fuel and the chemical energy is directly converted into electric energy. Accordingly, the fuel cell is not subject to the thermodynamic limit called Carnot efficiency, unlike a heat engine, according to an electricity generation characteristic and does not use fossil fuels such as coal and oil, and thus has little concern in environmental contamination, noise, and the like, thereby attracting attention as a next-generation energy source.

However, the complexity created by non-linear and irreversible relationships between current and voltage and those between current and power, which occur during the operation of a fuel cell stack, makes it difficult to accurately predict the performance and make a control for an optimized operation of the fuel cell stack. Particularly, a control system based on conventional models for operating a fuel cell does not simultaneously consider temporary performance degradation incurred under a non-optimized operation condition and the performance degradation according to deterioration and durability degradation due to a long-term operation, and there has been a problem that the difference between the temporary performance degradation and the performance degradation according to deterioration and durability degradation due to a long-term operation is not distinguished.

That is, the operation under the non-optimized condition causes temporary performance degradation due to flooding caused by water being generated inside the fuel cell, drying of an electrolyte membrane, and shortage in a flow rate of reaction gas, and when the temporary performance degradation state is continued, deterioration and durability degradation of the fuel cell system are accelerated, so that it is necessary to rapidly detect an abnormal state of the fuel cell and to implement the predictive control of the performance.

Further, in order to improve the durability of the fuel cell, there are demands on the optimization and control algorithm for the operation condition in consideration of the degree of long-term performance degradation along with the diagnosis of temporary and recoverable performance degradation.

DETAILED DESCRIPTION OF THE INVENTION

Technical Problem

The present invention is conceived to solve the foregoing problems, and an object of the present invention is to provide an artificial intelligent fuel cell system, which learns and analyzes data collected with a predetermined time interval by using machine learning and a time series analysis to generate a model for predicting and controlling the performance of a fuel cell, compares the generated model with measured data to distinguish the change in performance over time of a fuel cell stack into a temporary and short-term performance degradation state and a long-term and irreversible performance degradation state and diagnose the performance change state, and generates a control signal for changing an operation condition of the fuel cell stack according to the diagnosed state of the fuel cell stack.

Technical Solution

An artificial intelligent fuel cell system according to an exemplary embodiment of the present invention may include: a fuel cell stack in which a plurality of unit cells is combined for generating electric energy with an electrochemical reaction; each of the unit cells that consist of the fuel cell stack; a sensor unit which measures in real time data about temperatures, pressure, humidity, and flow rates of reaction gases and cooling water, and current and voltage data during an operation of a fuel cell; an artificial intelligent unit which collects the data measured by the sensor unit with a predetermined time interval, generates a model for predicting and controlling performance of the fuel cell through the learning and analysis of the collected data, compares the generated model with the data measured in real time and diagnoses a state of the fuel cell stack, and generates a control signal for changing an operation condition of the fuel cell stack; and a control unit which changes the operation condition of the fuel cell stack according to the generated control signal.

Further, the artificial intelligent unit according to the exemplary embodiment of the present invention may include: a data collecting unit which collects the data about the temperatures, the pressure, the humidity, the flow rates, the current, and the voltage measured by the sensor unit in real time with a predetermined time interval; a data learning and model generating unit which learns and analyzes the data collected with the predetermined time interval by using machine learning and a time series analysis and generates a model for predicting and controlling performance of the fuel cell; and a performance predicting and diagnosing unit which compares the generated model with the measured data, distinguishes the change in performance over time of the fuel cell stack into the first state and the second state, and diagnoses the performance change state, and generates a control signal for changing an operation condition of the fuel cell stack according to the diagnosed state of the fuel cell stack and makes the control unit change the operation condition of the fuel cell stack, and the first state may be a temporary and short-term performance degradation state, and the second state may be a long-term and irreversible performance degradation state.

Further, the data learning and model generating unit according to the exemplary embodiment of the present invention may include: a machine learning unit which generates a model for predicting performance through a machine learning algorithm with the data collected at the predetermined time interval, and makes the performance predicting and diagnosing unit compare a prediction value from the generated model with a measurement value of the measured data and diagnose a state of the fuel cell stack; and a time series analyzing unit which performs a time series trend analysis analyzing a time trend pattern by using the prediction value and the measurement value, and makes the performance predicting and diagnosing unit distinguish the change in performance over time of the fuel cell stack into the first state and the second state and diagnose the performance change state, and the first state may be a temporary and short-term performance degradation state, and the second state may be a long-term and irreversible performance degradation state.

Further, the machine learning unit according to the exemplary embodiment of the present invention may feed a variance that is a difference between the prediction value and the measurement value back to the generated prediction model and correct the generated prediction model, and make the performance predicting and diagnosing unit diagnose the performance change state of the fuel cell stack according to time by using the corrected prediction model.

A method of controlling an artificial intelligent fuel cell system according to another exemplary embodiment of the present invention may include: measuring in real time data about each of the unit cells forming a fuel cell stack, temperature, pressure, humidity, and flow rates of reaction gases, and cooling water, and current and voltage data during an operation of a fuel cell; collecting the measured data with a predetermined time interval and generating a model for predicting and controlling performance of the fuel cell through the learning and analysis of the collected data; comparing the generated model with the data measured in real time and diagnosing a state of the fuel cell stack; and generating a control signal for changing an operation condition of the fuel cell stack according to the diagnosed state; and changing the operation condition of the fuel cell stack according to the generated control signal.

Further, the generating of the model for predicting and controlling the performance according to the exemplary embodiment of the present invention may include learning and analyzing the data collected with the predetermined time interval by using machine learning through a machine learning algorithm and a time series analysis through a time series trend analysis and generating a model for predicting and controlling performance of the fuel cell, the diagnosing of the state of the fuel cell stack may include comparing the generated model with the measured data, distinguishing a change in performance over time of the fuel cell stack into the first state and the second state, and diagnosing the performance change state, and the first state may be a temporary and short-term performance degradation state, and the second state may be a long-term and irreversible performance degradation state.

Further, the method of controlling an artificial intelligent fuel cell system according to the exemplary embodiment of the present invention may further include: feeding a variance that is a difference between a prediction value of the generated model and a measurement value measured in real time back to the generated prediction model and correcting the generated prediction model; and distinguishing the change in performance over time of the fuel cell stack into the first state and the second state by using the corrected prediction model, and diagnosing the performance change state, and the first state may be a temporary and short-term performance degradation state, and the second state may be a long-term and irreversible performance degradation state.

In the meantime, still another exemplary embodiment of the present invention may provide a computer-readable recording medium in which a program for executing the method in a computer is recorded.

Advantageous Effects

The artificial intelligent fuel cell system according to the exemplary embodiment of the present invention may generate a model for predicting and controlling performance of a fuel cell by machine learning and time-series trend analysis of fuel cell data collected with a predetermined time interval by the machine learning unit and the time-series analyzing unit.

Further, the artificial intelligent fuel cell system according to the exemplary embodiment of the present invention may diagnose whether a current state of the fuel cell stack is a normal state or an abnormal state by performing the machine learning and the time-series analysis through by machine learning unit and the time-series analyzing unit.

Further, the artificial intelligent fuel cell system according to the exemplary embodiment of the present invention may distinguish a performance degradation state of the fuel cell stack according to time into a temporary and short-term performance degradation state and a long-term and irreversible performance degradation state and diagnose the performance degradation state through a time-series trend analysis using a trend line.

Further, the artificial intelligent fuel cell system according to the exemplary embodiment of the present invention may correct the model for predicting performance of the fuel cell by calculating a difference between a prediction value of the prediction model generated through the machine learning algorithm and the time-series analysis and a measurement value as a variance and continuously feeding the variance back to the model, thereby more accurately diagnosing a performance change state of the fuel cell stack according to time and optimizing an operation condition of the fuel cell according to the diagnosis of the state.

BEST MODE

Figure 1:
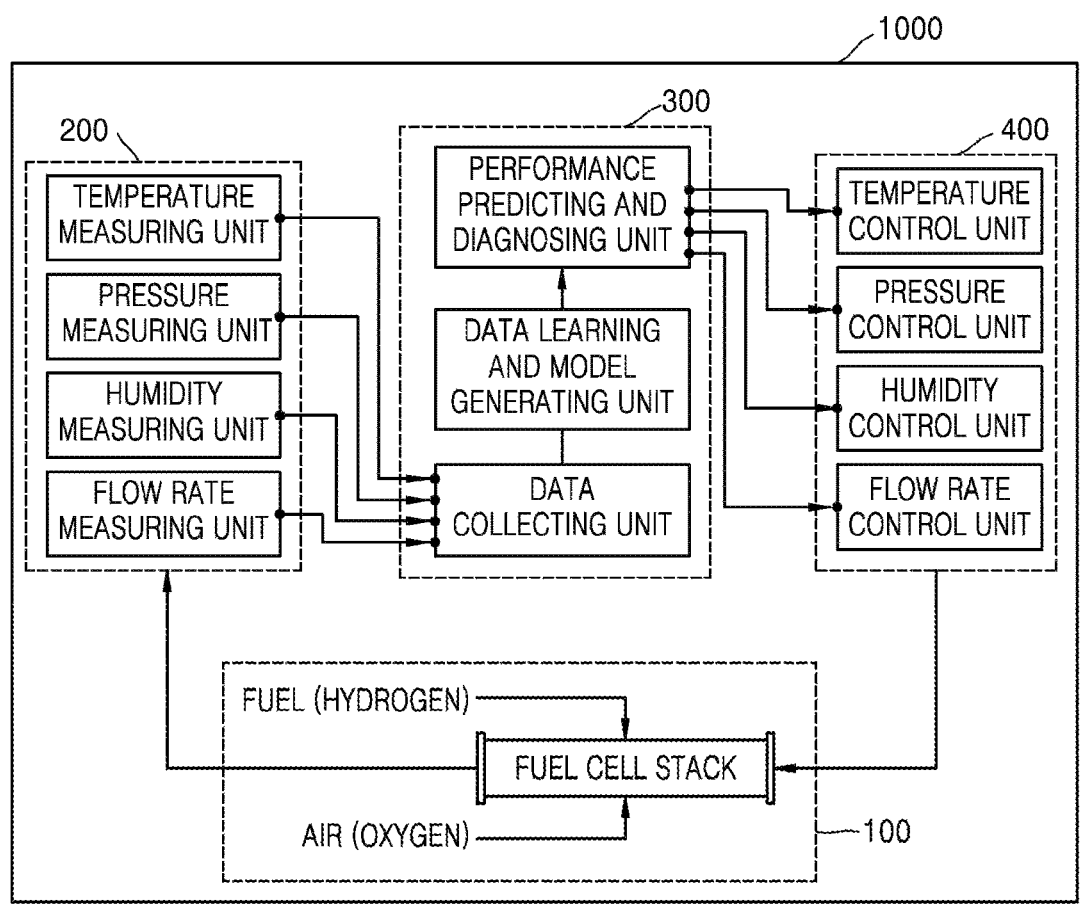
FIG. 1 is a block diagram illustrating a configuration of an artificial intelligent fuel cell system according to an exemplary embodiment of the present invention.

An artificial intelligent fuel cell system according to an exemplary embodiment of the present invention may include: a fuel cell stack in which a plurality of unit cells is combined for generating electric energy with an electrochemical reaction; each of the unit cells forming the fuel cell stack; a sensor unit which measures in real time data about each of the unit cells forming the fuel cell stack, temperature, pressure, humidity, and flow rates of reaction gases, and cooling water, and current and voltage data during an operation of a fuel cell; an artificial intelligent unit which collects the data measured by the sensor unit with a predetermined time interval, generates a model for predicting and controlling performance of the fuel cell through the learning and analysis of the collected data, compares the generated model with the data measured in real time and diagnoses a state of the fuel cell stack, and generates a control signal for changing an operation condition of the fuel cell stack; and a control unit which changes the operation condition of the fuel cell stack according to the generated control signal.

Further, the artificial intelligent unit according to the exemplary embodiment of the present invention may include: a data collecting unit which collects the data about the temperatures, the pressure, the humidity, the flow rates, the current, and the voltage measured by the sensor unit in real time with a predetermined time interval; a data learning and model generating unit which learns and analyzes the data collected with the predetermined time interval by using machine learning and a time-series analysis and generates a model for predicting and controlling performance of the fuel cell; and a performance predicting and diagnosing unit which compares the generated model with the measured data, distinguishes a change in performance over time of the fuel cell stack into the first state and the second state, and diagnoses the performance change state, and generates a control signal for changing an operation condition of the fuel cell stack according to the diagnosed state of the fuel cell stack and makes the control unit change the operation condition of the fuel cell stack, and the first state may be a temporary and short-term performance degradation state, and the second state may be a long-term and irreversible performance degradation state.

Further, the data learning and model generating unit according to the exemplary embodiment of the present invention may include: a machine learning unit which generates a model for predicting performance through a machine learning algorithm processing the data collected with the predetermined time interval, and makes the performance predicting and diagnosing unit compare a prediction value from the generated model with a measurement value of the measured data and diagnose a state of the fuel cell stack; and a time series analyzing unit which performs a time-series trend analysis analyzing a time trend pattern by using the prediction value and the measurement values, and makes the performance predicting and diagnosing unit distinguish the change in performance over time of the fuel cell stack into the first state and the second state and diagnose the performance change state, and the first state may be a temporary and short-term performance degradation state, and the second state may be a long-term and irreversible performance degradation state.

Further, the machine learning unit according to the exemplary embodiment of the present invention may feed a variance that is a difference between a prediction value and a measurement value back to the generated prediction model and correct the generated prediction model, and make the performance predicting and diagnosing unit diagnose the performance change state of the fuel cell stack according to time by using the corrected prediction model.

A method of controlling an artificial intelligent fuel cell system according to another exemplary embodiment of the present invention may include: measuring in real time data about temperatures, pressure, humidity, and flow rates of each of the unit cells forming a fuel cell stack, reaction gas, and cooling water, and current and voltage data during an operation of a fuel cell; collecting the measured data with a predetermined time interval and generating a model for predicting and controlling performance of the fuel cell through the learning and analysis of the collected data; comparing the generated model with the data measured in real time and diagnosing a state of the fuel cell stack; generating a control signal for changing an operation condition of the fuel cell stack according to the diagnosed state; and changing the operation condition of the fuel cell stack according to the generated control signal.

Further, the generating of the model for predicting and controlling the performance according to the exemplary embodiment of the present invention may include learning and analyzing the data collected with the predetermined time interval by using machine learning through a machine learning algorithm and a time-series analysis through a time-series trend analysis and generating a model for predicting and controlling performance of the fuel cell, the diagnosing of the state of the fuel cell stack may include comparing the generated model with the measured data, distinguishing a change in performance over time of the fuel cell stack according to time into the first state and the second state, and diagnosing the performance change state, and the first state may be a temporary and short-term performance degradation state, and the second state may be a long-term and irreversible performance degradation state.

Further, the method of controlling an artificial intelligent fuel cell system according to the exemplary embodiment of the present invention may further include: feeding a variance that is a difference between a prediction value of the generated model and the measurement value measured in real time back to the generated prediction model and correcting the generated prediction model; and distinguishing the change in performance over time of the fuel cell stack into the first state and the second state by using the corrected prediction model, and diagnosing the performance change state, and the first state may be a temporary and short-term performance degradation state, and the second state may be a long-term and irreversible performance degradation state.

In the meantime, still another exemplary embodiment of the present invention may provide a computer-readable recording medium in which a program for executing the method in a computer is recorded.

MODE FOR CARRYING OUT THE INVENTION

Hereinafter, exemplary embodiments of the present invention will be described in detail with reference to the accompanying drawings so that those skilled in the art can easily carry out the present invention. However, the present invention may be modified in various different forms, and is not limited to the exemplary embodiments described herein. A part irrelevant to the description will be omitted in the drawings to clearly describe the present invention, and the similar elements will be designated by the similar reference numerals throughout the specification.

Terms used in the present specification will be briefly described, and the present invention will be described in detail.

As the terms used in the present invention, general terms, which are currently and widely used in consideration of a function in the present invention, have been selected as possible as it can, but the terms used in the present invention may be changed according to intentions of those skilled in the art or judicial precedents, appearance of new technology, or the like. Further, in a specific case, there is a term arbitrarily selected by an applicant, and in this case, a meaning of the term will be described in detail in the corresponding description of the invention. Accordingly, the terms used in the present invention shall be defined based on the meaning of the term and the contents throughout the present invention, not the simple name of the term.

Throughout the specification, unless explicitly described to the contrary, when it is said that a specific part "comprises/includes" a specific constituent element, this means that another constituent element may be further "included/comprised", not that another constituent element is excluded. In addition, the term, such as " . . . unit" and " . . . module" described in the specification means a unit for processing at least one function or operation and may be implemented by hardware components or software components and combinations thereof. Throughout the specification, when it is described that an element is "connected" to another element, the element may be "directly connected" to the other element or "indirectly connected" to the other element through a third element.

Hereinafter, the present invention will be described in detail with reference to the accompanying drawings.

Figure 2:
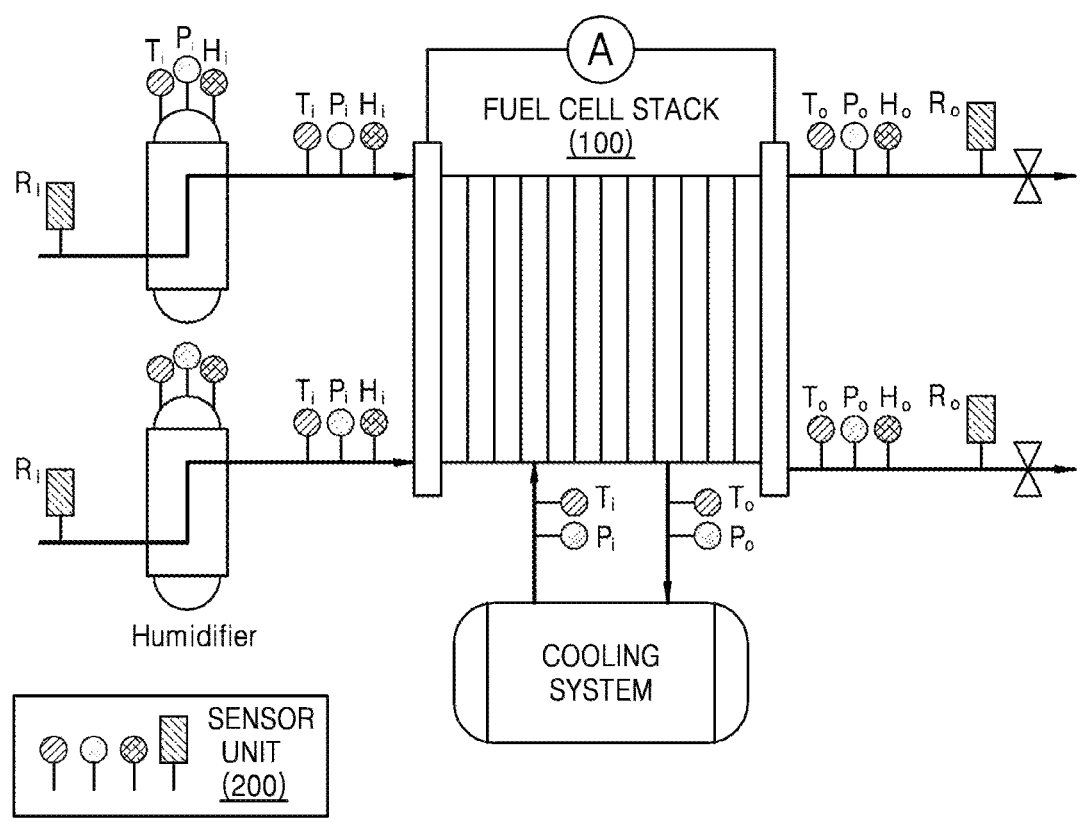
FIG. 2 is a diagram schematically illustrating a configuration of a sensor unit installed in a fuel cell stack according to the exemplary embodiment of the present invention.

FIG. 1 is a block diagram illustrating a configuration of an artificial intelligent fuel cell system 1000 according to an exemplary embodiment of the present invention, and FIG. 2 is a diagram schematically illustrating a configuration of a sensor unit 200 installed in a fuel cell stack 100 according to the exemplary embodiment of the present invention.

Referring to FIG. 1, the artificial intelligent fuel cell system 1000 may include a fuel cell stack 100, a sensor unit 200, an artificial intelligent unit 300, and a control unit 400.

The fuel cell stack 100 according to the exemplary embodiment of the present invention is an apparatus in which a plurality of unit cells is combined for generating electric energy with an electrochemical reaction, and is formed by stacking the plurality of unit cells, thereby supplying required power to an apparatus, such as a vehicle. Herein, the unit cell generates water and heat as by-products while generating electric energy with an electrochemical reaction, and may include an anode bipolar plate, a cathode bipolar plate, a gasket, and the like.

The sensor unit 200 according to the exemplary embodiment of the present invention may measure in real time data about temperatures, pressure, humidity, and flow rates of each of the unit cells forming the fuel cell stack 100, reaction gas, and cooling water, and current and voltage data during an operation of a fuel cell.

Referring to FIG. 2, the sensor unit 200 may measure in real time data about temperatures, pressure, humidity, flow rates, and the like of reaction gas (fuel) and cooling water supplied to the fuel cell stack 100, and each unit cell at various positions including an inlet and an outlet of the fuel cell stack. For example, the sensor unit 200 may measure data about a temperature, pressure, humidity, a flow rate, and the like for a positive electrode and a negative electrode of the unit cell, for every unit cell of the fuel cell stack, or for the entire fuel cell stack.

Further, the sensor unit 200 may also measure in real time a current (density), voltage data, or a change in current and voltage data generated during an operation of the fuel cell stack 100 for every unit cell or for the entire fuel cell stack.

The artificial intelligent unit 300 according to the exemplary embodiment of the present invention may collect the data measured by the sensor unit 200 with a predetermined time interval, and generate a model for predicting and controlling performance of the fuel cell through the learning and analysis of the collected data. For example, the artificial intelligent unit 300 may collect the data about the temperatures, the pressure, the humidity, and the flow rates of each unit cell, the reaction gas, and the cooling water, and the current and voltage data during the operation of the fuel cell, which are measured by the sensor unit 200 with a predetermined time interval, and store all of the collected data in the form of time-series data. Herein, the predetermined time interval may include a part or an entirety of an operation time of the fuel cell from a unit of second to a unit of minute, hour, day, month, and year.

Further, the artificial intelligent unit 300 may learn and analyze the collected data by using a method of machine learning, a time-series analysis, and the like and generate a model for predicting and controlling performance of the fuel cell, and compare the generated model for predicting and controlling the performance with the data measured in real time and diagnose a state of the fuel cell stack 100, and generate a control signal for changing the operation condition of the fuel cell stack 100.

That is, since the real-time operation data influencing performance (I-V) of the fuel cell includes complexity and interdependence, in order to generate the model for predicting and controlling the performance, machine learning-based modelling capable of explaining a plurality of correlations may be applied.

Further, when an operation time is increased, performance may be degraded due to deterioration of the fuel cell, and the degradation of the performance due to the deterioration of the fuel cell needs to be distinguished from a temporary performance degradation phenomenon, while it may be difficult to distinguish between a temporary and short-term performance degradation state and a long-term and irreversible performance degradation state when applying a single machine learning algorithm. That is, in order to distinguish between the temporary performance degradation phenomenon and the long-term performance degradation phenomenon, a pattern analysis of time series data through a time-series analysis is complexly used with a machine learning algorithm, thereby accurately diagnosing a state of the fuel cell stack 100 and generating an optimized control signal according to the diagnosed state.

Figure 3:
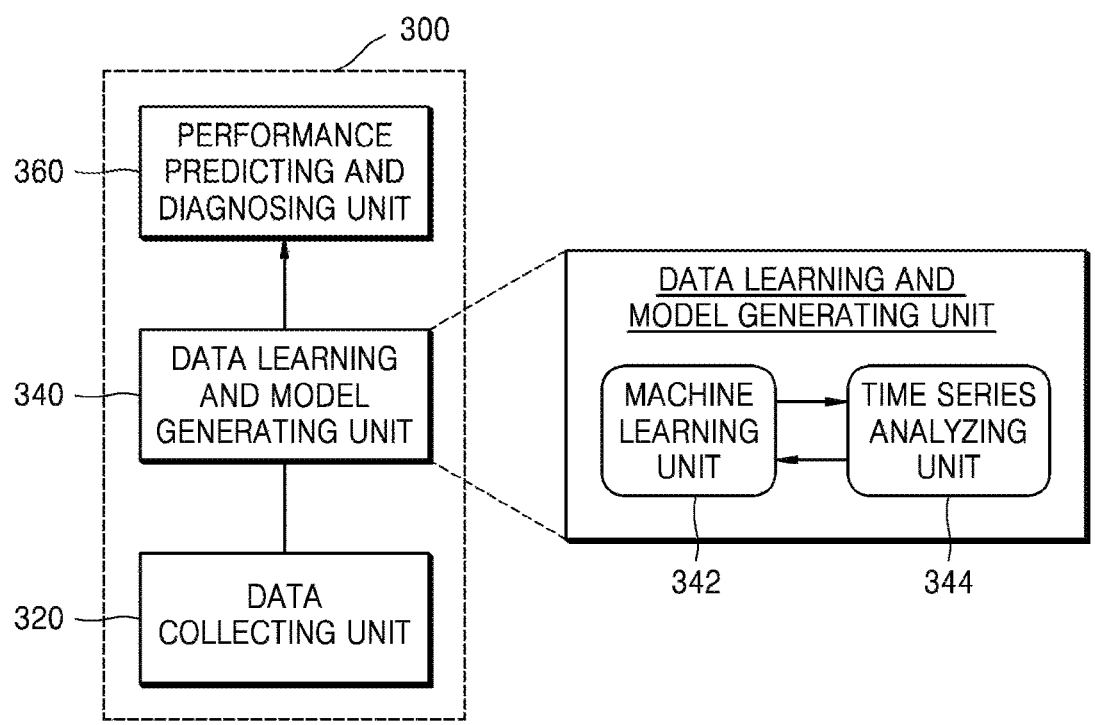
FIG. 3 is a block diagram illustrating a configuration of an artificial intelligent unit according to the exemplary embodiment of the present invention.

FIG. 3 is a block diagram illustrating a configuration of the artificial intelligent unit 300 according to the exemplary embodiment of the present invention.

Referring to FIG. 3, the artificial intelligent unit 300 may include a data collecting unit 320, a data learning and model generating unit 340, and a performance predicting and diagnosing unit 360, and the data learning and model generating unit 340 may include a machine learning unit 342 and a time series analyzing unit 344.

The data collecting unit 320 according to the exemplary embodiment of the present invention may collect the data about each of the unit cells forming the fuel cell stack, temperature, pressure, humidity, and flow rates of the reaction gases, and the cooling water, and the current and voltage data during the operation of the fuel cell, which are measured by the sensor unit 200 in real time with a predetermined time interval. The data collecting unit 320 may store all of the measured data in the form of time series data for a time-series analysis based on time, adjust a data storing time interval from a unit of second to a unit of year, and include a part or an entirety of an operation time of the fuel cell.

The data learning and model generating unit 340 may generate a model for predicting and controlling performance of the fuel cell by using the data collected with the predetermined time interval, and the machine learning unit 342 may enable modelling for predicting and controlling performance by machine learning through a multi-variable correlation, and the time series analyzing unit 344 may analyze a state of the fuel cell in the form of a time series trend through a pattern analysis of the time series data, thereby generating a model for predicting and controlling performance of the fuel cell stack 100 according to a time.

That is, the machine learning unit 342 according to the exemplary embodiment of the present invention may generate a model through the machine learning algorithm for predicting performance based on the data which are collected with the predetermined time interval, and make the performance predicting and diagnosing unit 360 compare a prediction value from the generated model and a measured value of the measured data and diagnose a state of the fuel cell stack 100.

For example, the machine learning unit 342 may generate the data about the temperatures, the pressure, the humidity, and the flow rates, and the current and voltage data during the operation of the fuel cell, which are collected with the predetermined time interval, into a data structure that is in the form of a matrix structure, and apply various machine learning algorithms to generate a model for predicting performance. Further, the machine learning unit 342 may make the performance predicting and diagnosing unit 360 compare the prediction value in the performance predicting model with the measurement values measured in real time by the sensor unit 200 and determine whether the state of the fuel cell stack is a normal state or an abnormal state, such as flooding, drying of an electrolyte membrane, and a shortage in a flow rate of reaction gas, from the difference between the prediction value and the measurement value.

Further, the machine learning unit 342 may provide a determination on a change in an operation condition according to whether the diagnosed state of the fuel cell stack 100 is the normal state or the abnormal state, that is, a determination on maintaining or changing a control signal controlling the control unit 400.

The time series analyzing unit 344 according to the exemplary embodiment of the present invention may perform a time-series trend analysis which analyzes a time trend pattern by using the prediction value and the measured values to make the performance predicting and analyzing unit 360 distinguish the change in performance over time of the fuel cell stack 100 into two different states including a temporary and short-term performance degradation state and a long-term and irreversible performance degradation state due to deterioration and diagnose the performance change state.

For example, the time series analyzing unit 344 performs the time trend pattern analysis by using the prediction value of the performance predicting model generated by the machine learning unit 342 and the measurement values measured by the sensor unit 200 to make the performance predicting and diagnosing unit 360 distinguish a short-term performance degradation state section in which temporary performance degradation is incurred in the fuel cell stack 100 from a long-term performance degradation state section in which irreversible performance degradation due to the deterioration of the fuel cell is generated in the cell stack 100. Herein, the temporary and short-term performance degradation state section is a section in which the performance is temporarily degraded but the performance is recoverable to a normal state after a predetermined time after a change in an operation condition through a control, and may mean a section in which reversible performance degradation is incurred.

Figure 4:
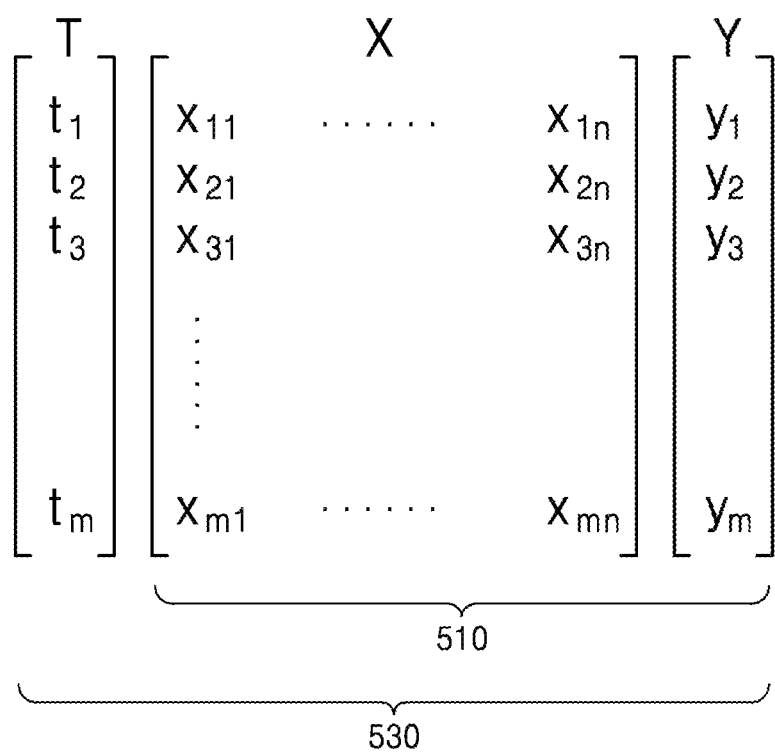
FIG. 4 is a diagram illustrating a structure of data measured and collected by a sensor unit in the form of a matrix according to the exemplary embodiment of the present invention.

FIG. 4 is a diagram illustrating a structure of the data measured and collected by the sensor unit 200 in the form of a matrix according to the exemplary embodiment of the present invention.

Referring to FIG. 4, respective columns t1, t2, . . . of a matrix T represent a time column, and respective columns of a matrix X represent data, such as temperatures, pressure, flow rates, and humidity, at several points of the fuel cell stack 100, which are measured by the sensor unit 200 over time. Further, one column of the matrix X may include time series data of the current (density) measured based on each time. A matrix Y represents a measurement of any variable among a cell voltage V, a current density I, and power density measured at each time. Further, a data structure 510 that is formed of the matrices X and Y represents a data structure for creating a prediction model through the machine learning algorithm. That is, the data structure 510 that is formed of the matrices X and Y may represent a data structure for creating X→Y and Y=f(X). The prediction model Y=f(X) may have various forms including a linear regression model, such as $Y=\Sigma_{i=1}^{n} a_i X_i$, according to the applied machine learning algorithm.

The machine learning prediction model may be represented by Equation 1 below.

$$Y=f(X) \quad \text{[Equation 1]}$$

In Equation 1, X is data of a reaction gas flow rate R, a temperature T, pressure P, humidity H, and current (density) I, and Y is data of current (density) I, voltage V, and power (density) W.

Further, a data structure 530 that is formed of the matrices X, Y, and T represents a data structure for a time-series analysis, and may be formed of (T, X, Y), (T, X), or (T, Y).

A time series model may be represented by Equation 2 below.

$$Y_{t+h}=\Phi+\alpha(L)Y_t+\beta(L)F_t+\varepsilon_{t+h} \quad \text{[Equation 2]}$$

In Equation 2, $Y_{t+h}$ represents a prediction term for a time interval t+h, $\Phi$ represents a constant term, $\alpha(L)Y_t$ represents a function term of Y at time t, $\beta(L)F_t$ represents a prediction model term of Y at time t, and $\varepsilon_{t+h}$ represents a prediction error term.

Further, the machine learning unit 342 according to the exemplary embodiment of the present invention may feed a variance that is a difference between the prediction value and the measurement value back to the generated prediction model and correct the generated prediction model, and may make the performance prediction and diagnosing unit 360 diagnose the performance change state of the fuel cell stack 100 according to time by using the corrected prediction model.

That is, the machine learning unit 342 may calculate a difference between the prediction value of the prediction model generated through the machine learning algorithm and the time-series analysis and the measurement value measured by the sensor unit 200 as a variance, and continuously feed the variance back to the fuel cell prediction model to correct the fuel cell prediction model. That is, the performance prediction and diagnosing unit 360 diagnoses the performance change state of the fuel cell stack 100 according to time based on the corrected fuel cell prediction model, thereby more accurately diagnosing a state of the fuel cell.

The performance prediction and diagnosing unit 360 according to the exemplary embodiment of the present invention may diagnose a state of the fuel cell stack according to the fuel cell prediction and control model generated by the learning and analysis of the machine learning unit 342 and the time series analyzing unit 344.

For example, the performance prediction and diagnosing unit 360 may compare the prediction value of the generated fuel cell prediction model with the measurement values measured in real time, and determine whether a current state of the fuel cell stack is a normal state or an abnormal state, such as a flooding state, a dry state of an electrolyte membrane, a shortage stage of a reaction gas flow rate.

Further, the performance prediction and diagnosing unit 360 may distinguish the change in performance over time of the fuel cell stack 100 into a temporary and short-term performance degradation state and a long-term and irreversible performance degradation state through the time-series trend analysis of the time series analyzing unit 344 and diagnose the performance change state.

Further, the performance prediction and diagnosing unit 360 may generate a control signal for changing an operation condition of the fuel cell stack 100 according to the diagnosed state of the fuel cell stack 100.

The control unit 400 according to the exemplary embodiment of the present invention may change the operation condition of the fuel cell stack 100 according to the control signal generated by the artificial intelligent unit 300.

For example, the artificial intelligent unit 300 may diagnose whether the fuel cell stack 100 is currently in a long-term and irreversible performance degradation state or a temporary and reversible performance degradation state through the diagnosis of the state of the fuel cell stack 100. When the artificial intelligent unit 300 diagnoses that the fuel cell stack 100 is in the reversible performance degradation state, the artificial intelligent unit 300 may determine whether the state of the fuel cell stack 100 is a flooding state, a dry state of the electrolyte membrane, or a shortage state of the reaction gas flow rate, and in order to recover the temporary performance degradation, the artificial intelligent unit 300 may generate a control signal for changing an operation condition of the fuel cell and transmit the generated control signal to the control unit 400. That is, the control unit 400 may change an operation condition according to the control signal generated by the artificial intelligent unit 300, thereby recovering the performance of the fuel cell stack 100 which is in the flooding state, the dry state of the electrolyte membrane, and the shortage state of the reaction gas flow rate.

Figure 5:
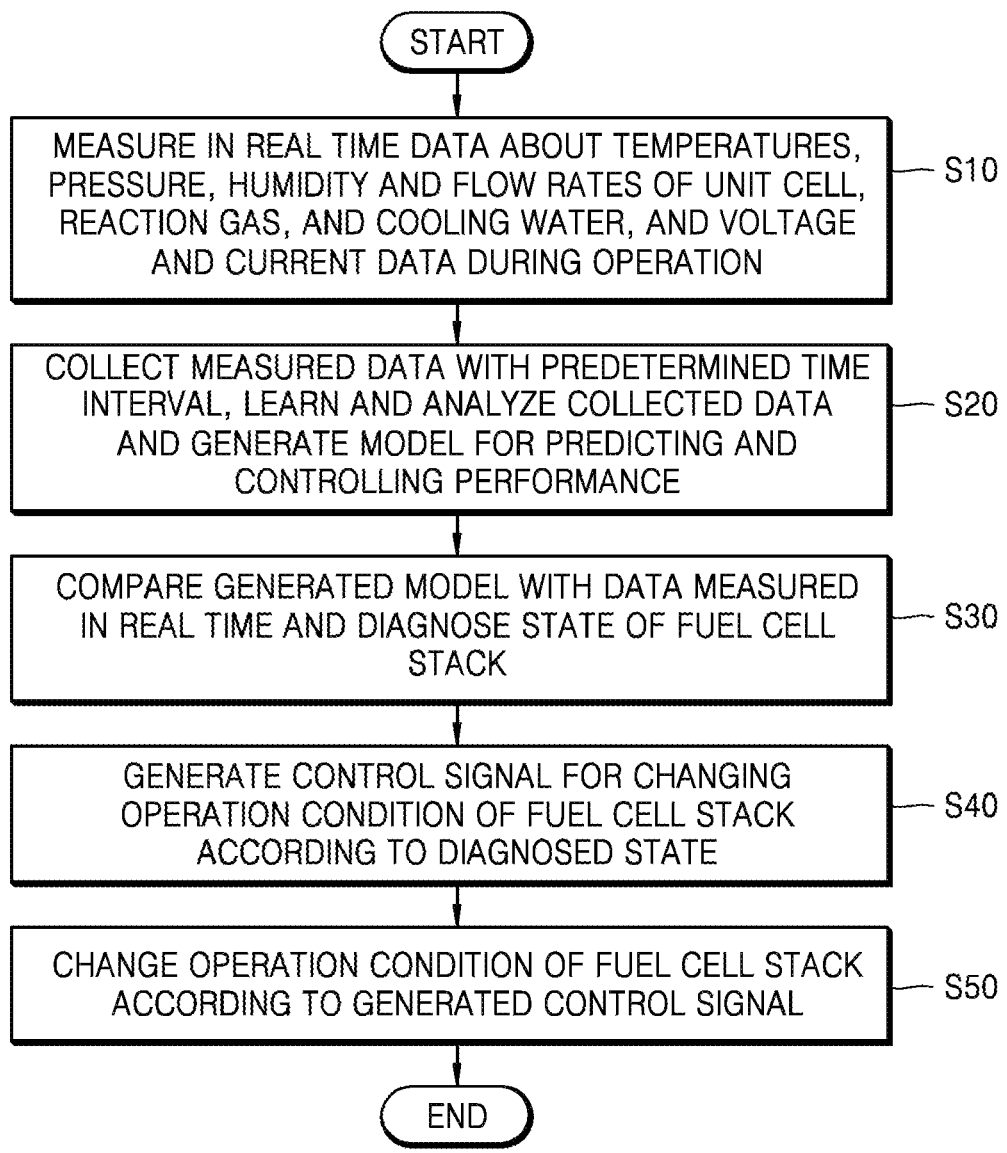
FIG. 5 is a flowchart illustrating a method of controlling an artificial intelligent fuel cell system according to another exemplary embodiment of the present invention.

FIG. 5 is a flowchart illustrating a method of controlling the artificial intelligent fuel cell system 1000 according to another exemplary embodiment of the present invention.

Referring to FIG. 5, the sensor unit 200 may measure in real time data about each of the unit cells forming the fuel cell stack 100, temperature, pressure, humidity, and flow rates of reaction gases and cooling water, and current and voltage data during an operation of the fuel cell (S10), and the data collecting unit 320 may collect the measured data with a predetermined time interval, and the data learning and model generating unit 340 may generate a model for predicting and controlling performance of the fuel cell through the learning and analysis of the collected data (S20).

For example, the sensor unit 200 may measure in real time data about each of the unit cells, temperature, pressure, humidity, and flow rates of reaction gases and cooling water at several positions including an inlet and an outlet of the fuel cell stack 100, and also measure in real time current and voltage data during an operation of the fuel cell and a change in current and voltage data. Further, the data collecting unit 320 may collect the measured data with a time interval including a part or an entirety of an operation time of the fuel cell in a unit from second to minute, hour, day, month, and year. The data learning and model generating unit 340 may learn and analyze the collected data by using machine learning through a machine learning algorithm and a time-series analysis through a time-series trend analysis, and generate a model for predicting and controlling the performance of the fuel cell.

The performance predicting and diagnosing unit 360 may compare the prediction model generated by the data learning and model generating unit 340 with the data measured in real time and diagnose a state of the fuel cell stack 100 (S30), and generate a control signal for changing an operation condition of the fuel cell stack according to the diagnosed state (S40). The control unit 400 may change an operation condition of the fuel cell stack 100 according to the generated control signal (S50).

For example, the performance predicting and diagnosing unit 360 may compare a prediction value of the generated fuel cell performance prediction model with the measurement values measured in real time and distinguish whether a current state of the fuel cell stack is a normal state or an abnormal state. Further, the performance predicting and diagnosing unit 360 may distinguish a change in performance over time of the fuel cell stack into a temporary and short-term performance degradation state and a long-term and irreversible performance degradation state through a time-series trend analysis of the time series analyzing unit 344 and diagnose the change state of the performance of the fuel cell stack. Further, the performance predicting and diagnosing unit 360 may generate a control signal according to the current state or the performance change state of the fuel cell stack 100 according to time, and the control unit 400 may change the operation condition of the fuel cell stack 100 according to the control signal.

Figure 6:
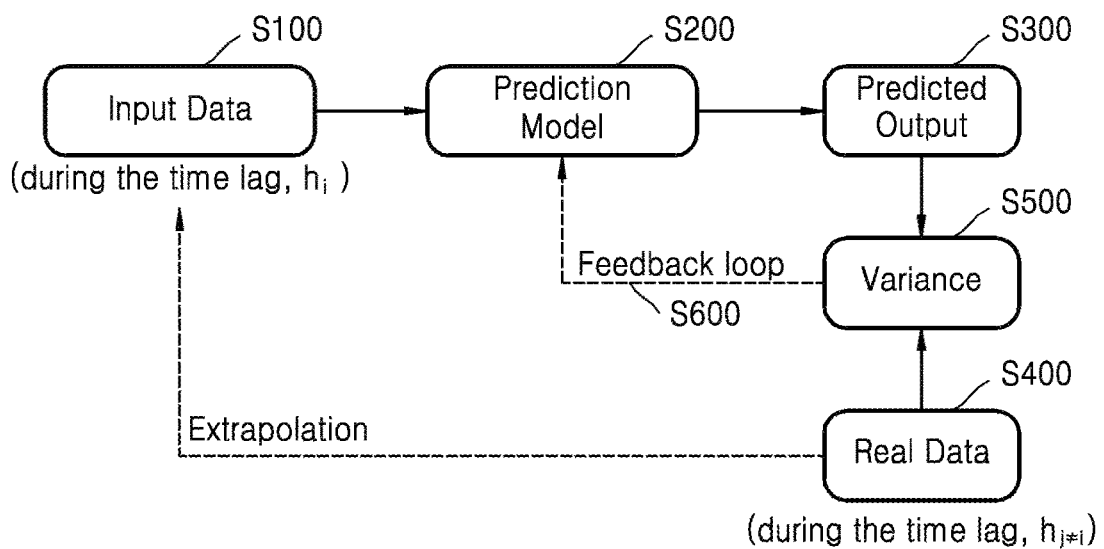
FIG. 6 is a flowchart illustrating a method of correcting a model for predicting and controlling performance of the fuel cell by a machine learning unit according to the exemplary embodiment of the present invention.

FIG. 6 is a flowchart illustrating a method of correcting a fuel cell performance prediction and control model by the machine learning unit 342 according to the exemplary embodiment of the present invention.

Referring to FIG. 6, the artificial intelligent fuel cell system 1000 may collect data about each of the unit cells forming the fuel cell stack 100, temperature, pressure, humidity, and flow rates of reaction gases, and cooling water, and current and voltage data during an operation of a fuel cell for a predetermined time interval $h_i$ by the data collecting unit 320 (S100), and generate a fuel cell performance prediction and control model by using the collected data (S200). Herein, the fuel cell performance prediction and control model may be generated by using machine learning and a time-series analysis using the collected data.

The artificial intelligent fuel cell system 1000 may calculate prediction values of current, voltage, power density, and the like in the generated fuel cell performance prediction model (S300), and obtain a measured value that is actually measured by the sensor unit 200 (S400). The machine learning unit 342 may compare the calculated prediction value with the actually measured measurement values and calculate a variance which is a difference between the calculated prediction value and the actually measured measurement values (S500), and feed the variance back to the generated prediction model and correct the generated prediction model (S600).

Figure 7:
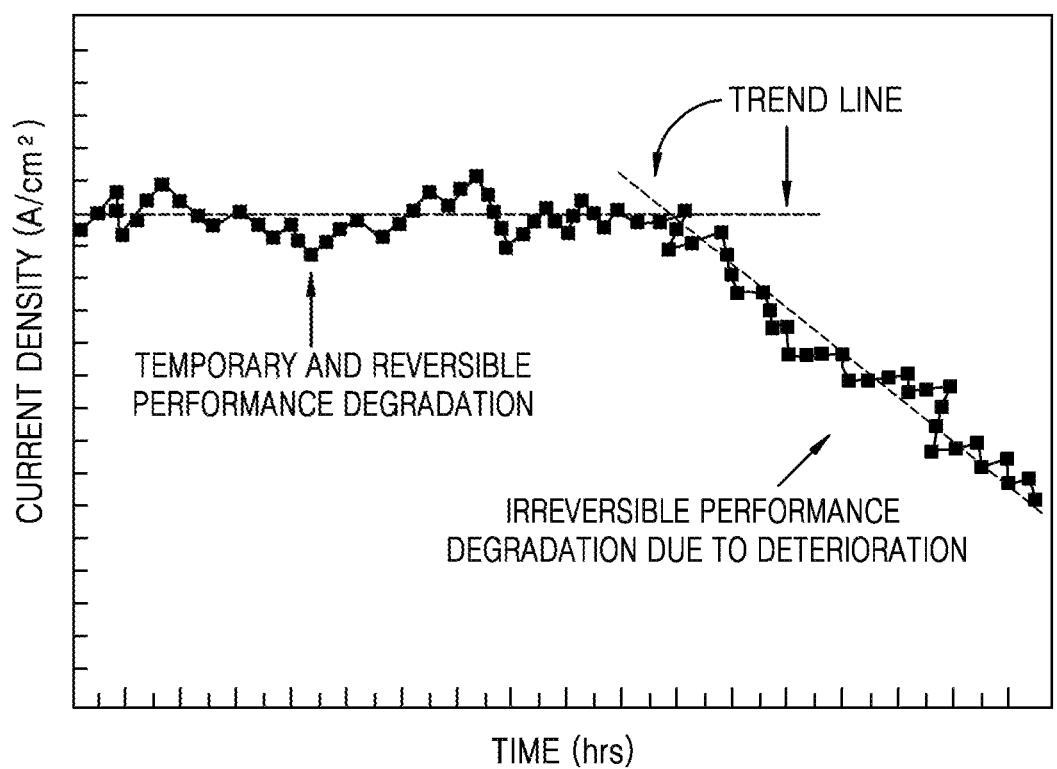
FIG. 7 is a graph illustrating a short-term performance degradation state and a long-term performance degradation state through a trend analysis of current density time series data according to the exemplary embodiment of the present invention.

FIG. 7 is a graph illustrating a short-term performance degradation state and a long-term performance degradation state through a trend analysis of current density time series data according to the exemplary embodiment of the present invention.

Referring to FIG. 7, a output current density may be changed within a small range in a short term during a constant voltage operation of the fuel cell, but the change may be reversibly recovered, and may be distinguished from irreversible performance degradation due to deterioration in each component of the fuel cell according to a long-term operation.

That is, when a trend line of a current density of the fuel cell according to time is analyzed through the time-series trend analysis of FIG. 7, it is possible to distinguish a temporary and short-term performance degradation section, in which performance may be reversibly recovered, from a long-term and irreversible performance degradation section according to deterioration in a component of the fuel cell. That is, the trend at the beginning of the time series causes a variation of a predetermined reference or more after a predetermined time elapses, and the trend according to the variation may be followed. Accordingly, in order to predict and diagnose performance degradation of the fuel cell, a plurality of trend models may be configured.

The linear model illustrated in FIG. 7 may be used as the trend model of the time series data, but a quadratic function model, a cubic function model, or an exponential function model may be applied to the trend model of the time series data according to a form of the deterioration of the fuel cell.

The contents of the artificial intelligent fuel cell system 1000 may be applied to the method of controlling the artificial intelligent fuel cell system 1000 according to the exemplary embodiment of the present invention. Accordingly, in relation to the method of controlling the artificial intelligent fuel cell system 1000, descriptions of the same contents as the contents of the artificial intelligent fuel cell system 1000 are omitted.

The exemplary embodiment of the present invention may also be implemented in the form of a recording medium including a command executable by a computer, such as a program module executed by a computer. A computer-readable medium may be a predetermined available medium that can be accessed by computer, and include all of volatile and non-volatile media and removable and non-removable media. Further, the computer-readable medium may include all of a computer storage medium. The computer storage medium includes all of the volatile and non-volatile media and the removable and non-removable media implemented by a predetermined method or technology for storing information, such as a computer-readable command, a data structure, a program module, or other data.

The above description of the present invention is illustrative, and those skilled in the art to which the present invention pertains may understand that the present invention may be easily modified to other particular forms without changing the technical spirit or the essential feature of the present invention. Thus, it is to be appreciated that the embodiments described above are illustrative in all aspects, not restrictive. For example, each constituent element described in a singular form may be distributed and carried out, and similarly, constituent elements described in a distributed form may be carried out in a combination form.

The scope of the present invention is represented by the claims to be described below rather than the detailed description, and it is to be interpreted that the meaning and scope of the claims and all the changes or modified forms derived from the equivalents thereto come within the scope of the present invention.

The invention claimed is:

1. An artificial intelligent fuel cell system, comprising:
   a fuel cell stack in which a plurality of unit cells for generating electric energy with an electrochemical reaction is combined;
   a sensor assembly configured to measure, in real time, data about each of the unit cells forming the fuel cell stack, temperature, pressure, humidity, and flow rates of reaction gases, and cooling water, and current and voltage data during an operation of the fuel stack;
   an artificial intelligent processor configured to:
   collect the data measured by the sensor assembly in a predetermined time interval,
   learn and analyze the collected data by using machine learning and a time-series analysis,
   generate a model for predicting and controlling performance of the fuel cell stack through the learning and analyzing of the collected data,
   diagnose a state of the fuel cell stack by comparing the generated model with the data measured in real time, and
   generate a control signal for changing an operation condition of the fuel cell stack; and
   a controller configured to change the operation condition of the fuel cell stack according to the generated control signal,
   wherein the artificial intelligent processor includes:
   a performance predicting and diagnosing assembly which compares the generated model with the measured data, distinguishes a change in performance over time of the fuel cell stack into the first state and the second state, and diagnoses the performance change state, and generates a control signal for changing an operation condition of the fuel cell stack according to the diagnosed state of the fuel cell stack and makes the control unit change the operation condition of the fuel cell stack, and
   wherein the first state is a temporary and short-term performance degradation state, and the second state is a long-term and irreversible performance degradation state.

2. The artificial intelligent fuel cell system of claim 1, wherein the artificial intelligent processor includes:
   a data collecting assembly which collects the data about the temperature, the pressure, the humidity, the flow rates, the current, and the voltage measured by the sensor unit in real time with a predetermined time interval; and
   a data learning and model generating assembly which learns and analyzes the data collected by using the machine learning and the time-series analysis and generates the model for predicting and controlling performance of the fuel cell.

3. The artificial intelligent fuel cell system of claim 2, wherein the data learning and model generating assembly includes:

a machine learning assembly which generates the data collected as a model for predicting performance through a machine learning algorithm, and makes the performance predicting and diagnosing assembly compare a prediction value from the generated model with a measurement value of the measured data and diagnose a state of the fuel cell stack; and a time series analyzing assembly which performs a time-series trend analysis analyzing a time trend pattern by using the prediction value and the measurement values, and makes the performance predicting and diagnosing assembly distinguish the change in performance over time of the fuel cell stack into the first state and the second state and diagnose the performance change state.

4. The artificial intelligent fuel cell system of claim 3, wherein the machine learning assembly feeds a variance that is a difference between the prediction value and the measurement value back to the generated prediction model and corrects the generated prediction model, and makes the performance predicting and diagnosing assembly diagnose the performance change state of the fuel cell stack according to time by using the corrected prediction model.

5. A method of controlling an artificial intelligent fuel cell system, the fuel cell system including a fuel cell stack having a plurality of unit cells, the method comprising:

measuring, in real-time, data about each of the unit cells forming a fuel cell stack, temperature, pressure, humidity, and flow rates of reaction gases, and cooling water, and current and voltage data during an operation of the fuel cell stack;

collecting the measured data in a predetermined time interval;

learning and analyzing the data collected data by using machine learning and a time-series analysis;

generating a model for predicting and controlling performance of the fuel cell stack through the learning and analysis of the collected data;

comparing the generated model with the data measured in real time and diagnosing a state of the fuel cell stack;

generating a control signal for changing an operation condition of the fuel cell stack according to the diagnosed state; and changing the operation condition of the fuel cell stack according to the generated control signal, wherein the diagnosing of the state of the fuel cell stack includes comparing the generated model with the measured data, distinguishing a change in performance over time of the fuel cell stack into the first state and the second state, and diagnosing the performance change state, and wherein the first state is a temporary and short-term performance degradation state, and the second state is a long-term and irreversible performance degradation state.

6. The method of claim 5, wherein the learning and analyzing the data collected by using the machine learning through a machine learning algorithm and the time-series analysis through a time-series trend analysis and generating the model for predicting and controlling performance of the fuel cel.

7. The method of claim 6, further comprising:

feeding a variance that is a difference between a prediction value of the generated model and a measurement value measured in real time back to the generated prediction model and correcting the generated prediction model; and distinguishing the change in performance over time of the fuel cell stack into the first state and the second state by using the corrected prediction model, and diagnosing the performance change state.

8. A computer-readable recording medium in which a program for implementing the method of claim 5 is recorded.

* * * * *